(12) United States Patent
Lai

(10) Patent No.: US 7,005,707 B2
(45) Date of Patent: Feb. 28, 2006

(54) ELECTROSTATIC DISCHARGE PROTECTION CIRCUIT

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 83 days.

(21) Appl. No.: 10/703,259

(22) Filed: Nov. 6, 2003

(65) Prior Publication Data
US 2005/0023614 A1    Feb. 3, 2005

(30) Foreign Application Priority Data
Jul. 30, 2003   (TW) .............................. 092120768 U

(51) Int. Cl.
*H01L 23/62* (2006.01)
(52) U.S. Cl. .......................... 257/355; 257/59; 257/72
(58) Field of Classification Search ................... 257/59, 257/72, 355
See application file for complete search history.

(56) References Cited

U.S. PATENT DOCUMENTS 5,798,534 A  *  8/1998  Young ........................ 257/59

* cited by examiner

*Primary Examiner*—Howard Weiss
(74) *Attorney, Agent, or Firm*—J.C. Patents

(57) ABSTRACT

A structure of an electrostatic discharge protection circuit comprises a plurality of thin film transistors and at least a point structure, wherein each of the thin film transistors comprises a gate and a source/drain. The point structure configures at least a portion of a tail or an edge of the gate. In particular, the point structure is located at region apart from the source/drain. The point structures are disposed at prescribed areas apart from devices, and thereby the devices of the electrostatic discharge protection circuit are free from electrostatic discharges.

17 Claims, 4 Drawing Sheets

ELECTROSTATIC DISCHARGE PROTECTION CIRCUIT

CROSS-REFERENCE TO RELATED APPLICATION

This application claims the priority benefit of Taiwan application serial no. 92120768, filed on Jul. 30, 2003.

BACKGROUND OF THE INVENTION

1. Field of the Invention

The present invention relates to an electrostatic discharge protection circuit, or ESD protection circuit. More particularly, the present invention relates to an electrostatic discharge protection circuit in a liquid crystal display (LCD).

2. Description of the Related Art

Electrostatic discharge is a phenomenon that electrostatic charge moves along the surface of a non-conductive material, which might damage circuit devices in an integrated circuit and other circuitry. For instance, when a human being is walking on a carpet, hundreds or even thousands of voltages of electrostatic potential might be detected under high relative humidity, whereas even tens of thousands of voltages might be detected under low relative humidity.

During a LCD fabrication, relevant machinery platforms and technicians under operation can carry electrostatic charges, thus when these charge bearers contact the LCD panels, an electrostatic discharge event might take place, and the momentary discharge might harm the LCD devices and permanently disable the circuitry.

In order to avoid device and circuitry damage caused by ESD, generally an ESD circuit is equipped with, are not in display on a LCD panel. The ESD circuit is usually formed along the periphery of a substrate (area not in display) under TFT fabrication. The detail description is as a first metal layer (M1) is defined on the substrate in the display are in order to form scanning lines and gates of active devices, gates of ESD circuit in the area not in display is as well defined on the substrate. Consequently, when a second metal layer (M2) is defined to form data lines and source/drain of the active devices in the area in display on the substrate, the source/drain of ESD circuit is as well defined in the area not in display on the substrate. Therefore, when the display panel suffers from ESD impact, the ESD scheme is triggered and the electrostatic charges are drained, thus internal circuitry and devices are free from direct discharge damage.

However, conventional ESD circuitry suffers from some issues, i.e. ESD circuit easily discharge at a point or a corner, or locations that bear high current density, so that devices in the vicinity are damaged easily. This is caused by conventional circuit layout, where corners and bending of ESD circuitry are involved, so that current density increases, and ESD occurs therein. In addition, ordinary ESD circuit is constructed with points in some locations in the layout, therefore chances of damage to vicinity devices is high. Provided the ESD circuitry are located at regions where the discharge event occur, the entire ESD circuit would be disabled.

SUMMARY OF THE INVENTION

One object of the present invention is to provide an ESD protection circuit, so that ESD occurring at specific locations can be effectively avoided and thereby devices can be effectively prevented from being damaged.

Another object of the present invention is to provide a structure of an ESD protection circuit comprising a plurality of TFT and at least a point structure, wherein each of the TFT comprises a gate and a drain/source. The point structure configures a portion of at least one of the tail or the edge of the TFT gate. More particularly, the drain/source can be linearly laid out, and the point structure is positioned in a location apart from the drain/source. Moreover, the shape of the point structure can be comprised of a structure having an acute angle or a structure tapering down from the gate.

The present invention further provides another ESD protection circuit for improving ESD configured at an intersection of a first wiring of the ESD circuit, wherein the structure of the ESD circuit comprises a plurality of thin film transistors (TFTs), a second wiring and at least a point structure. Each TFT comprises a gate and a drain/source, and the second wiring couples to the drain/source of the TFT, as well as crosses the first wiring. Furthermore, the point structure is located in the viscinity of the intersection of the first wiring and the second wiring, and is coupled to either the first wiring or the second wiring; or one part of the point structure is coupled to the first wiring and another part thereof is coupled to the second wiring.

The present invention further provides a structure of an ESD protection circuit coupling to a first wiring. The ESD protection circuit comprises at least one pseudo ESD device. The pseudo ESD device is arranged aside of the ESD device at the outermost position. The pseudo ESD device of the present invention comprises a plurality of pseudo TFTs, a pseudo second wiring and at least a point structure. Wherein each of the pseudo TFTs comprises a pseudo gate and a pseudo source/drain. The pseudo second wiring couples to the pseudo source/drain of the pseudo TFT, and the second wiring extends to barely reach the first wiring. In addition, the point structure is located at the edge of the first wiring in the vicinity of the end of the pseudo second wiring. Another point structure can configure the end of the pseudo second wiring in the present invention.

The present invention further provides a structure of an ESD protection circuit coupling to a first wiring. The ESD protection circuit comprises a plurality of ESD devices and at least a pseudo ESD device, wherein the ESD device is arranged adjacent to the ESD device at the outermost position. The pseudo ESD device in the present invention comprises a plurality of TFTs, a pseudo second wiring and at least a point structure. Each of the pseudo TFT comprises a pseudo gate and a pseudo source/drain. The pseudo second wiring couples the pseudo source/drain of the pseudo TFT, and the pseudo second wiring crosses the first wiring. Moreover, the point structure is configured in the vicinity of where the first wiring and the pseudo second wiring intersect, and couples to at least one of the first wiring and the pseudo second wiring.

A point structure is configured in the ESD protection circuit in a prescribed region, so as to drain electrostatic charges at a designated location, thus circuit devices are free from electrostatic discharge damage.

In the present invention a pseudo ESD scheme configures a point structure at a prescribed location, so that electrostatic discharge takes place at designated locations. Thus point discharge that causes damage can be eliminated from working devices.

These and other objects, features and advantages of the present invention will become apparent from the following detailed description of illustrative embodiments thereof, which is to be read in connection with the accompanying drawings.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention provides a structure of an Electrostatic Discharge (ESD) protection circuit having a point structure at prescribed locations, so that electrostatic charges are drained to designated locations. These prescribed locations are designated for avoiding devices or wiring, thus devices and wiring are rendered free from electrostatic impact. In the following paragraphs, a plurality of preferred embodiments is described along with reference to the attached diagrams of the structure of the ESD protection circuit of the present invention. Yet it will be apparent to those skilled in the art that various modifications and variations can be made to the point structure without departing from the spirit and scope of the present invention.

First Preferred Embodiment

Figure 1:
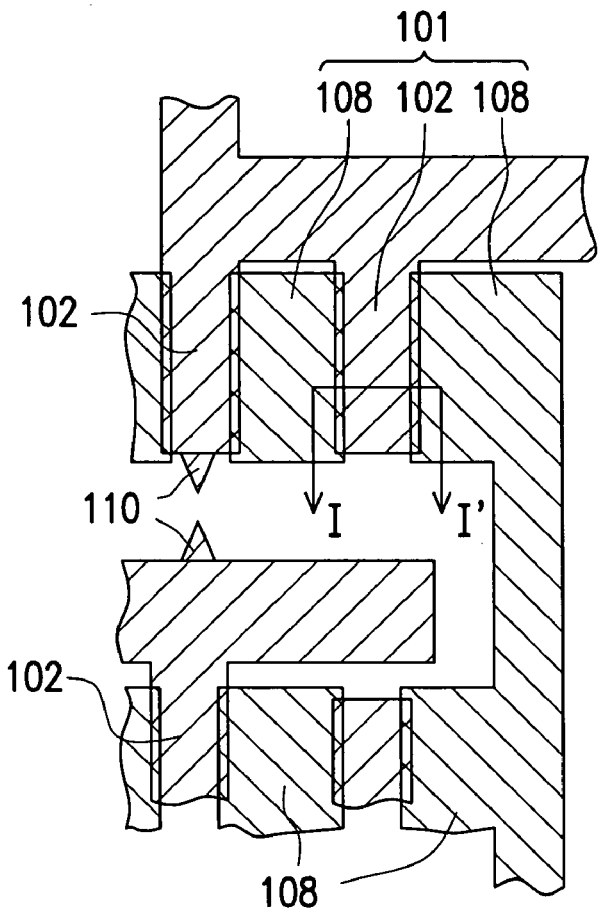
FIG. 1 is a top view diagram illustrating the electrostatic discharge (ESD) protection circuit according to a first preferred embodiment of the present invention.
Figure 2:
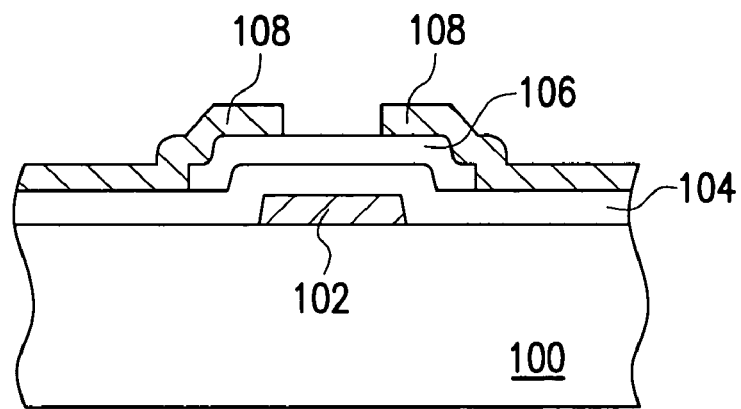
FIG. 2 is a cross-sectional view taken along I–I' ESD protection circuit as illustrated in FIG. 1.

Referring to FIG. 1, a top view diagram illustrating the structure of the ESD protection circuit according to a first preferred embodiment of the present invention is shown, and FIG. 2 is a cross-sectional view of FIG. 1 taken along I–I' line. Referring to both FIGS. 1 and 2, the ESD protection circuit comprises a plurality of TFTs 101 and at least a point structure 110. Each TFT 101 comprises a gate 102 and a source/drain 108. A dielectric layer 104 and a semiconductor layer 106 are formed between the gate 102 and the source/drain 108. The gate 102 formed over a substrate 100, and is comprised of a first metal layer (M1). The dielectric layer 104 is formed over the gate 102. The semiconductor layer 106 is formed over the dielectric layer 104, where the semiconductor 106 is comprised of a non-doped amorphous silicon layer (a.k.a. channel layer) and a doped amorphous silicon layer (a.k.a. Ohmic contact layer).

On the other hand, the source/drain 108 being comprised of a second metal layer (M2) is formed over the semiconductor layer 106 that corresponds to the location of the gate 102. In this preferred embodiment, the source/drain 108 is symmetrically and linearly laid out. As the source/drain 108 is linearly laid out, and therefore the corresponding gate 102 is also designed linear, and all devices are correspondingly symmetrically and linearly laid out thereby. This method of symmetrical and linear layout avoids crooked layout as in the case of the conventional ESD protection circuit, which induces relatively higher current density at a corner where ESD is prone to occur.

Figure 3:
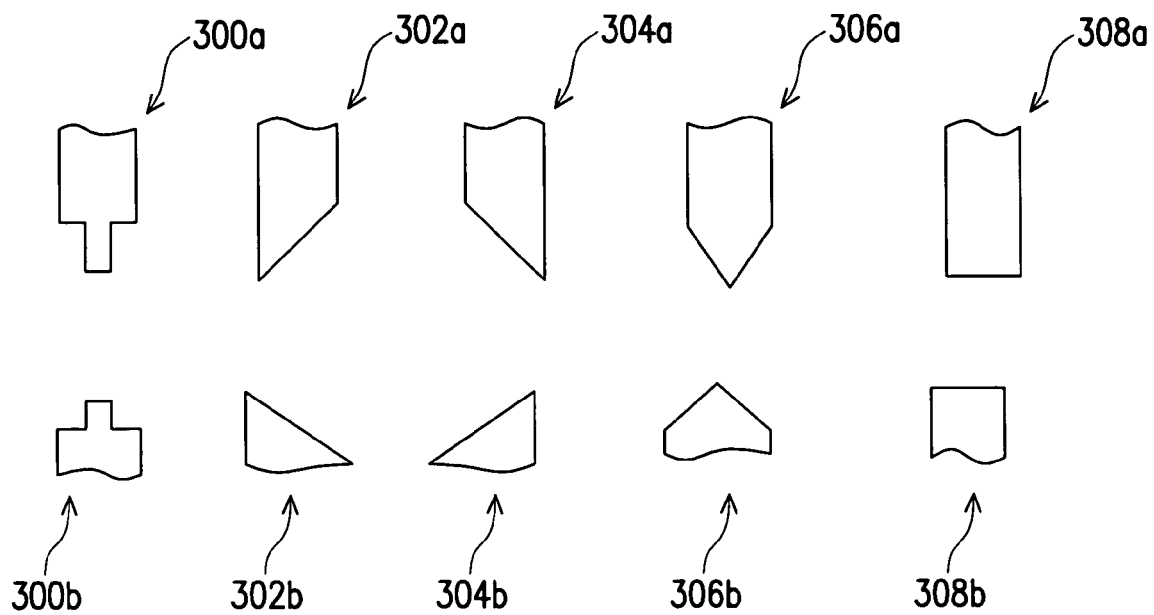
FIG. 3 demonstrates various shapes of the point structures according to one preferred embodiment of the present invention.

Moreover, the point structure 110 is configured as a portion of a tail or an edge of the gate 102, or both the tail and the edge thereof. Besides, the point structure 110 is located away from where devices and/or wiring are located, for instance, where the source/drain 108 is located. Wherein the point structure 110 can be a structure with an acute angle or constitute a tail of the gate having a tapering structure, as illustrated in FIG. 3. Referring to FIG. 3, the point structure can be comprised of a variety of structures, such as, a tapered-down tail 330a or an acute angle structure 302a, 304a, 306a, or even retaining the shape of the gate as shown in 308a yet extending down at the other end of the gate. Another point structure at the edge of the gate can be a convex structure as illustrated in 300b, 308b, or an acute angle structure as illustrated in 302b, 304b and 306b. The foregoing shapes of point structures can be randomly permuted and combined.

In light of the preferred embodiment, the point structure constitutes the tail and/or the edge portion of the gates 102, so as to protect devices from electrostatic damage.

Second Preferred Embodiment

Figure 4:
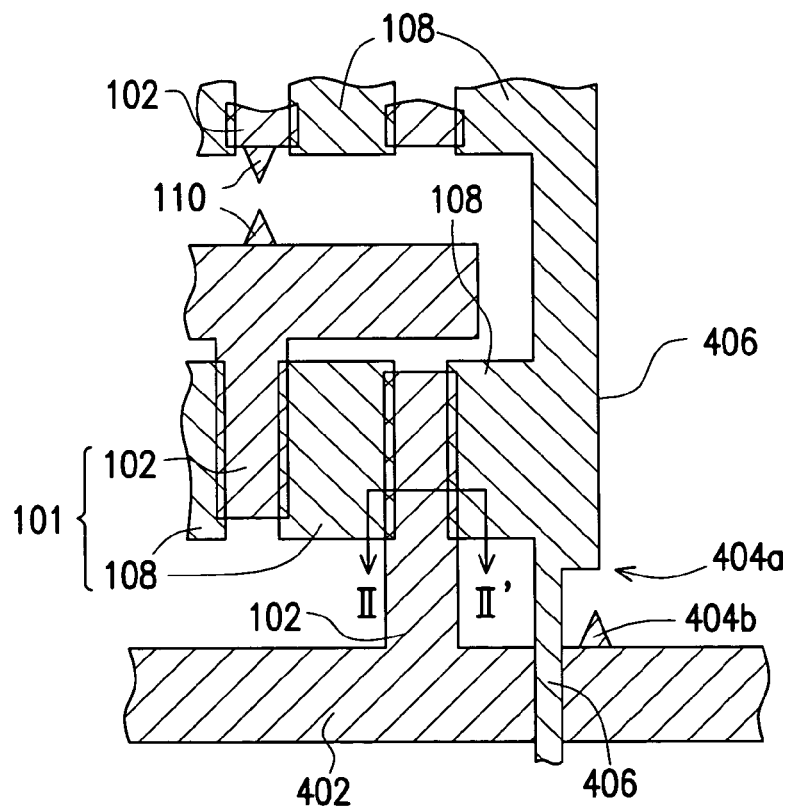
FIG. 4 is a top view diagram illustrating the ESD protection circuit according to a second preferred embodiment of the present invention.

Referring to FIG. 4, a top view diagram illustrating and ESD according to a second preferred embodiment of this present invention is shown, and a cross-sectional view of FIG. 2 taken along II–II' line is shown. The ESD protection circuit in this preferred embodiment improves ESD function when ESD protection circuit crosses a first wiring in the circuit layout. Referring to FIG. 4, the elements therein are represented with numerals similar to those in FIG. 1. Referring to both FIGS. 4 and 2, the ESD protection circuit in this preferred embodiment is coupled to a first wiring 402 (e.g. common line). The ESD protection circuit comprises a plurality of TFTs 101, a second wiring 406 (e.g. data line) and at least a point structure 404a or 404b.

The gate 102 and the common line 402 are comprised of a first metal (M1) layer, and the common line 402 is coupled to the gate 102 of the TFT 101. The dielectric layer 104 is formed over the gate 102 and the common line 402, and a semiconductor layer 106 is formed over the dielectric layer 104. On the other hand, the source/drain 108 is formed over the semiconductor layer 106 corresponding to the gate 102, wherein the source/drain 108 can be laid out linearly in one preferred embodiment of the present invention.

In addition, the data line 406 and the source/drain 108 are comprised of a second metal layer (M2), and are coupled to the source/drain 108 of the TFT 101, where the data line 406 crosses the common line 402. Usually electrostatic discharges in the vicinity of the intersection of the data line 406 and the common line 402, which induces a short between the data line 406 and common line 402. Therefore, a point structure 404a and 404b are positioned in the vicinity of the intersection of the data line 406 and the common line 402, so as to drain electrostatic charge to point structure 404a and 404b. Thus an electrostatic short between the data line 406 and the common line 402 is avoided accordingly.

The point structure 404a is positioned in the vicinity of the intersection of the common line 402 and the data line 406, wherein the point structure 404a is coupled to the data line 406. Moreover, the point structure 404b is positioned at the edge of the common line 402, and avoids the data line 406 as much as possible. In this preferred embodiment, it is also feasible to equip the common line 402 with point structure 404b around edge thereof, or only configure the data line 406 with the point structure 404a. Similarly, the point structures 404a and 404b are not limited to the shapes that are shown in the accompanying figures, the point structures 404a and 404b can be of any other shapes that in order to practice the present invention.

The second preferred embodiment of this present invention provides not only point structures that are similar to 404a and 404b around the intersection of the data line 406 and the common line 402 for avoiding electrostatic short. This preferred embodiment also combines the technique of preventing the electrostatic damage described in the first preferred embodiment, wherein the point structure 110 located at the tail the or edge portion of the gate 102 is configured to drain electrostatic charges and thereby the electrostatic charges are kept away from devices or wiring.

Third Preferred Embodiment

Figure 5:
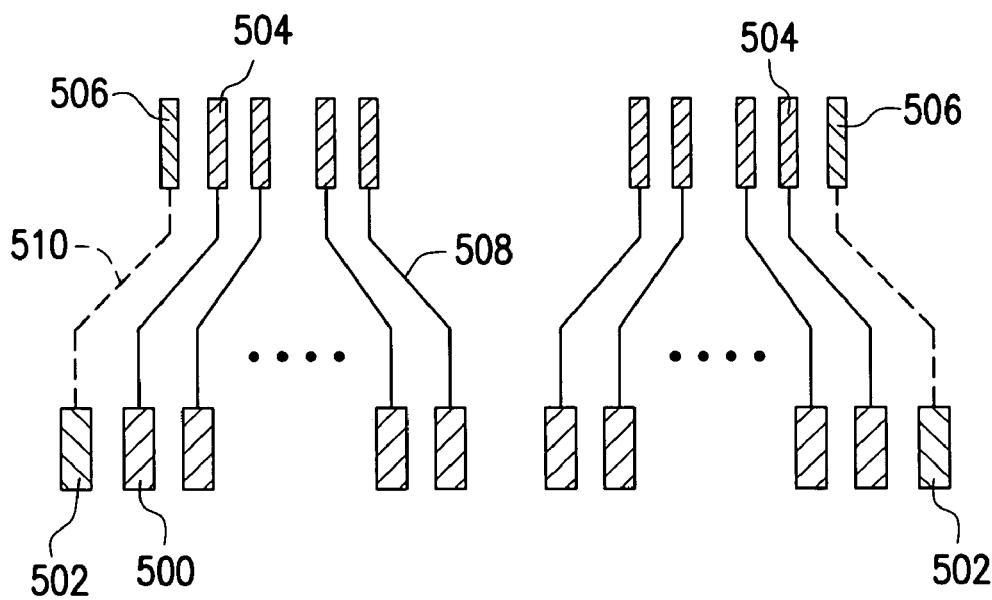
FIG. 5 is a top view diagram illustrating the ESD protection circuit according to a third preferred embodiment of the present invention.

Referring to FIG 5, a top view diagram illustrating ESD protection circuit structure according to a third preferred embodiment of this present invention is shown. The ESD protection circuit in this preferred embodiment comprises a plurality of ESD devices 500 and at least a pseudo ESD device 502, where the pseudo ESD device 502 is arranged adjacent to the ESD device 500, located at an outermost position. In other words, the pseudo ESD device 502 can be arranged on one or both sides of ESD device 500 area, where the ESD device 500 couples to other devices 504 (e.g. driving devices) via conducting line 508. Similarly, the pseudo ESD device 502 can also couple to a pseudo ESD structure 506 (e.g. pseudo driving. device) via the conducting line 508.

The foregoing ESD device 500 can be a conventional ESD protection circuit, or the ESD protection circuit design described in the first preferred embodiment, or that of the second preferred embodiment, or a combination thereof. The structure to the pseudo ESD device 502 is depicted as follows.

Figure 6:
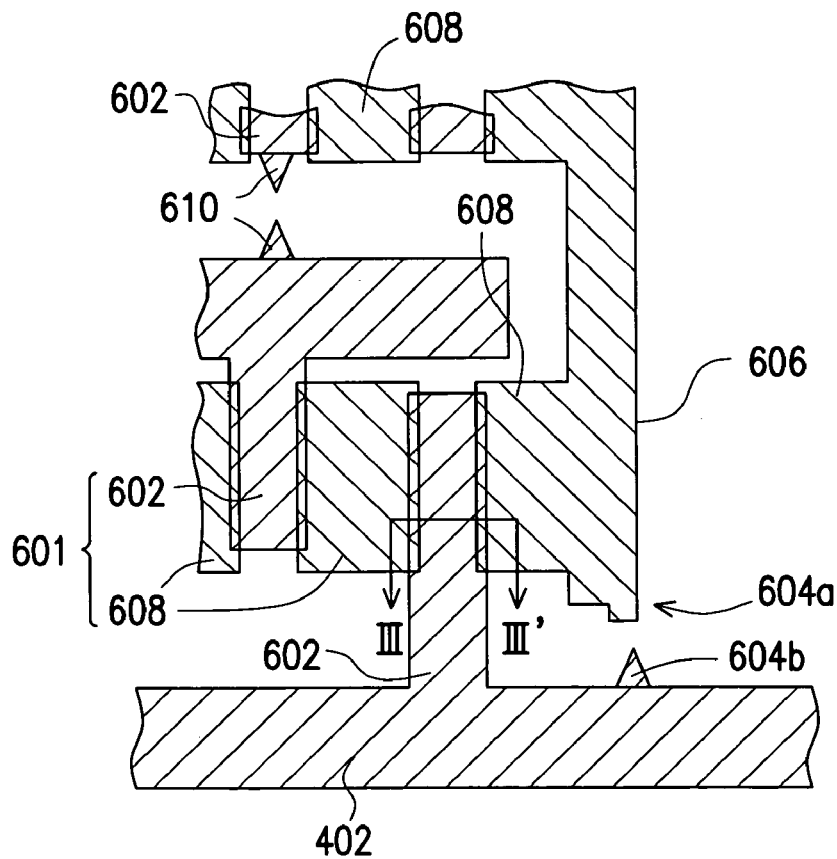
FIG. 6 is a top view diagram illustrating the pseudo ESD protection circuit shown in FIG. 5.
Figure 7:
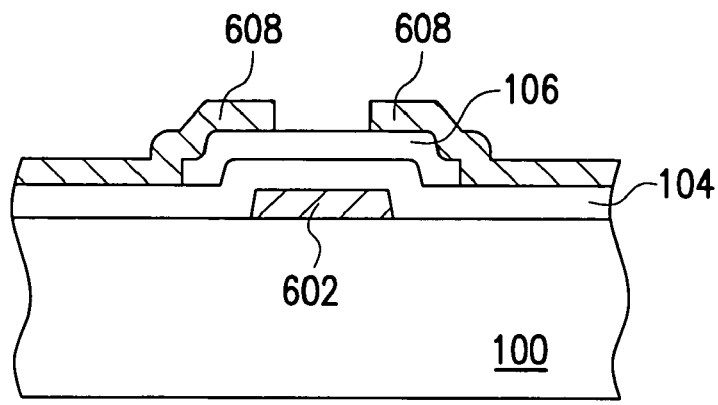
FIG. 7 is a cross-sectional view of the pseudo ESD protection circuit along III–III' illustrated in FIG. 6.

Referring to the FIGS. 6 and 7, FIG. 6 is the top view of the pseudo ESD device 502 as illustrated in FIG. 5, and FIG. 7 is a cross-sectional view of the pseudo ESD device 502 shown in FIG. 6 taken along the line III–III'. The foregoing ESD device 502 comprises a plurality of TFTs 601, a pseudo data line 606 and at least one of the point structure 604a or 604b. Wherein each of the pseudo TFT 601 comprises a pseudo gate 602 and a pseudo source/drain 608, wherein a dielectric layer 104 and a semiconductor layer 106 are further formed therein between the pseudo gate 602 and the pseudo source/drain 608. In particular, the ESD protection circuit couples to the common line 402 in this preferred embodiment, thus the common line 402 couples to the gate of the pseudo TFT 601, as well as couples to the foregoing gate of the ESD circuit 500 (not shown). It is to be noted that the source/drain 608 can be linearly laid out in this preferred embodiment.

In addition, the pseudo data line 606 merely couples to a portion of the source/drain 608, and the data line 606 merely extends to the vicinity of the common line 402. In other words, the pseudo data line 606 extends to barely reach the common line 402. Generally, an electrostatic discharge around intersection of two conducting lines (e.g. the intersection of the data line and the common line), the present invention particularly provides the pseudo data line 606 of the pseudo ESD device that extends to barely reach the common line 402. Moreover, the present invention also provides the point structure 604b along the edge of the common line 402 in the vicinity of the pseudo data line 606. Another point structure 604a can be optionally configured at the tail of the pseudo data line 606, so as to point discharge electrostatic charge at the two point structures 604a and 604b. Similarly, the point structures 604a and 604b is not limited to the shapes that are shown in the accompanying figures, and accordingly, the point structures 604a and 604b can be comprised of any shape. It is to be noted that the pseudo ESD device is not for actual electrostatic discharge, thus the pseudo data line is designed as an open circuit, which does not affect the ESD function at all.

In the third preferred embodiment of the present invention, the pseudo data line 606 of the pseudo ESD device is designed to be an open circuit for specific ESD location. It is also feasible to configure the tail or the edge portion of the gate 602 with the point structure 610 using the techniques described in the first preferred embodiment for discharging electrostatic charges.

Fourth Preferred Embodiment

The structure of the ESD protection circuit provided by the fourth preferred embodiment is similar to the third preferred embodiment, in that the pseudo ESD device is provided in both embodiments on one or both sides of the ESD device area except that the pseudo ESD device is laid out differently, whereas the ESD device is configured in the same manner as in the third preferred embodiment. Thus the description of which is omitted herein.

Figure 8:
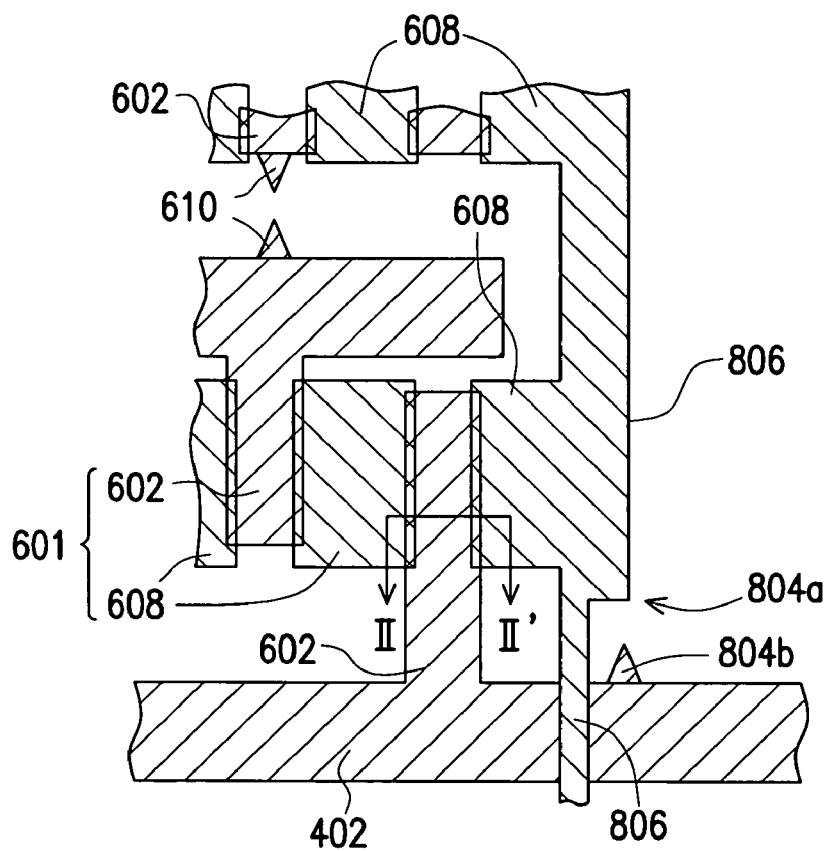
FIG. 8 is a top view diagram illustrating the ESD protection circuit according to a fourth preferred embodiment of the present invention.

Referring to FIGS. 8 and 7, FIG. 8 is a top view diagram illustrating the structure of the ESD protection circuit according to the fourth preferred embodiment of the present invention, and FIG. 7 is a cross-sectional view of the structure of the ESD protection circuit shown in FIG. 8 taken along III–III'. In this preferred embodiment, the ESD protection circuit comprises a plurality of TFTs 601, a pseudo data line 806, and at least a point structure 804a or 804b. Each of the pseudo TFT 601 comprises a pseudo gate 602 and a pseudo source/drain 608, a dielectric layer 104 and a semiconductor layer 106 are formed between the pseudo gate 602 and the pseudo source/drain 608. Similarly, the common line 402 couples to the gate of the pseudo TFT 601. In this preferred embodiment, the source/drain 608 can be linearly laid out.

Additionally, the pseudo data line 806 couples to the pseudo source/drain 608, and the pseudo data line 806 crosses the common line 402. Moreover, point structures 804a and 804b are configured around the vicinity of intersection of the pseudo data line 806 and the common line 402 so as to exert point discharge.

The point structure 804a couples to the pseudo data line 806 and the point structure 804b couples to the common line 402 being apart from the common line 402. Similarly, this preferred embodiment also provides the point structure 804b along the edge of the common line 402, or provides the point structure 804b along the edge of the pseudo data line 806. It is to be understood that the point structure 804a and 804b are not limited to the shapes that are shown in the figures, the point structures 804*a* and 804*b* can be comprised of any other shapes suitable to practice the present invention.

Similarly, this preferred embodiment can also be combined with the techniques provided in the first preferred embodiment, that is, to configure a portion of the tail of the pseudo gate 602 or the edge thereof with point structure 610 so as to discharge at designated locations.

It is noted that the pseudo ESD scheme is virtually identical to the ESD protection scheme, thus the pseudo ESD device can substitute the damaged ESD device if necessary, so as to increase fabrication yield.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure of an electrostatic discharge protection circuit, comprising:
   a plurality of thin film transistors, wherein each of the thin film transistors comprises a gate and a source/drain; and
   at least a point structure, integrally formed with some of gates of said thin film transistors at prescribed location, wherein the point structure constitutes a portion of at least a tail or an edge of said gate, whereby the point structure drains electrostatic charges.

2. The structure of the electrostatic discharge protection circuit as recited in claim 1, wherein said source/drain is linearly laid out.

3. The structure of the electrostatic discharge protection circuit as recited in claim 1, wherein the point structure is located at a region apart from where source/drain is located.

4. The structure of the electrostatic discharge circuit as recited in claim 1, wherein a shape of the point structure is comprised of an acute angled structure or tapering structure extending from the gate.

5. A structure of an electrostatic discharge protection circuit, for improving electrostatic discharge function when the electrostatic discharge circuit crosses a first wiring, the structure of the electrostatic discharge protection circuit comprising:
   a plurality of thin film transistors, wherein each of the thin film transistors comprises a gate and a source/drain;
   a second wiring coupling to the source/drain of each thin film transistor, wherein the second wiring crosses the first wiring; and
   at least a point structure configuring in a vicinity of an intersection of the first wiring and the second wiring, and the point structure coupling to at least one of the first wiring and the second wiring.

6. The structure of the electrostatic discharge protection circuit as recited in claim 5, further comprising at least a first point structure configuring at least a portion of a tail or an edge of the gate.

7. The structure of the electrostatic discharge protection circuit as recited in claim 6, wherein the first point structure is located at a region apart from the source/drain.

8. The structure of the electrostatic discharge protection circuit as recited in claim 5, wherein the source/drain is linearly laid out.

9. A structure of an electrostatic discharge protection circuit, wherein the electrostatic discharge circuit couples to a first wiring, the structure of the electrostatic discharge protection circuit comprising:
   a plurality of electrostatic discharge devices; at least a pseudo electrostatic discharge device, wherein the pseudo electrostatic discharge device is arranged adjacent to the electrostatic discharge devices at an outermost position, the pseudo discharge device comprising:
      a plurality of pseudo thin film transistors, wherein each of the pseudo thin film transistors comprises a pseudo gate and a pseudo source/drain;
      a pseudo second wiring coupling to the pseudo source/drain of the pseudo thin film transistor, wherein the pseudo second wiring extends to barely reach the first wiring; and
      at least a point structure configuring an edge of the first wiring located in a vicinity of an end of the pseudo second wiring.

10. The structure of the electrostatic discharge protection circuit as recited in claim 9, further comprising at least a first point structure configuring a tail of the pseudo second wiring.

11. The structure of the electrostatic discharge protection circuit as recited in claim 9, further comprising at least a second point structure configuring at least a portion of a tail and an edge of the pseudo gate.

12. The structure of the electrostatic discharge protection circuit as recited in claim 9, wherein the pseudo source/drain is linearly laid out.

13. A structure of the electrostatic discharge protection circuit, wherein the electrostatic discharge protection circuit couples to a first wiring, the structure of the electrostatic discharge protection circuit comprising:
   a plurality of electrostatic discharge device;
   at least a pseudo electrostatic discharge device, wherein the pseudo electrostatic device is arranged adjacent to the electrostatic devices at an outermost position, the pseudo electrostatic discharge device comprising:
      a plurality of pseudo thin film transistors, each of the pseudo thin film transistor comprising a pseudo gate and a pseudo source/drain;
      a pseudo second wiring coupling to the pseudo source/drain of the pseudo thin film transistors, and the pseudo second wiring crossing the first wiring; and
      at least a point structure, being positioned in a vicinity of an intersection of the first wiring and the pseudo second wiring, wherein the point structure couples to at least one of the first wiring and the pseudo second wiring.

14. The structure of the electrostatic discharge circuit as recited in claim 13, wherein a portion of the point structure couple to the first wiring, and another portion of the point structure couple to the pseudo second wiring.

15. The structure of the electrostatic discharge protection circuit as recited in claim 13, further comprising a first point structure configuring at least a portion of a tail or an edge of the gate.

16. The structure of the electrostatic discharge protection circuit as recited in claim 15, wherein the first point structure is located at least in a region apart from the source/drain.

17. The structure of the electrostatic discharge protection circuit as recited in claim 13, wherein the source/drain is linearly laid out.

* * * * *